United States Patent [19]

Thomas et al.

[11] 3,727,116

[45] Apr. 10, 1973

[54] INTEGRAL THYRISTOR-RECTIFIER DEVICE

[75] Inventors: Albert William Thomas, Somerville, N.J.; John Manning Savidge Neilson, Norristown, Pa.; Leon Stanley Greenberg, Somerville, N.J.

[73] Assignee: RCA Corporation, New York, N.Y.

[22] Filed: May 5, 1970

[21] Appl. No.: 34,820

[52] U.S. Cl. .....317/235 R, 317/235 E, 317/235 AB, 317/235 AE, 317/235 AM, 317/235 AQ

[51] Int. Cl. .....H01l 17/00

[58] Field of Search.....317/235

[56] References Cited

UNITED STATES PATENTS

| | | | |
|---|---|---|---|
| 3,284,639 | 11/1966 | Giuliano et al. | 317/235 |
| 3,117,260 | 1/1964 | Noyce | 317/235 |
| 3,261,985 | 7/1966 | Somos | 317/235 |
| 3,360,696 | 12/1967 | Neilson et al. | 317/235 |
| 3,440,113 | 4/1969 | Wolley | 148/187 |
| 3,440,114 | 4/1969 | Harper | 148/187 |
| 3,476,993 | 11/1969 | Aldrich et al. | 317/235 |
| 3,486,950 | 12/1969 | Lesk | 148/187 |

OTHER PUBLICATIONS

Applicant's Non–Pat Citation, IEEE Trans. or Elec Devices, "A High Voltage, High Temperature Reverse Conducting Thyristor" by Kokosa et al., Septemper 1970, pages 667–672.

*Primary Examiner*—Jerry D. Graig
*Attorney*—Glenn H. Bruestle

[57] ABSTRACT

A semiconductor switching device comprising a silicon controlled rectifier (SCR) and a diode rectifier integrally connected in parallel with the SCR in a single semiconductor body. The device is of the NPNP or PNPN type, having gate, cathode, and anode electrodes. A portion of each intermediate N and P region makes ohmic contact to the respective anode or cathode electrode of the SCR. In addition, each intermediate region includes a highly conductive edge portion. These portions are spaced from the adjacent external regions by relatively low conductive portions, and limit the conduction of the diode rectifier to the periphery of the device. A profile of gold recombination centers further electrically isolates the central SCR portion from the peripheral diode portion.

7 Claims, 5 Drawing Figures

INVENTORS:
ALBERT W. THOMAS;
JOHN M.S. NEILSON &
LEON S. GREENBERG

BY H. L. Allen
ATTORNEY

INVENTORS:
ALBERT W. THOMAS;
JOHN M. S. NEILSON &
LEON S. GREENBERG
BY H. L. Allen
ATTORNEY

INTEGRAL THYRISTOR-RECTIFIER DEVICE

BACKGROUND OF THE INVENTION

The present invention relates to semiconductor devices, and, in particular, relates to integral semiconductor switching devices designed to function alternatively as a thyristor or as a diode rectifier.

That class of thyristors known as controlled rectifiers are semiconductor switches having four semiconducting regions of alternate conductivity and which employ anode, cathode, and gate electrodes. These devices are usually fabricated from silicon. In its normal state, the silicon controlled rectifier (SCR) is non-conductive until an appropriate voltage or current pulse is applied to the gate electrode, at which point current flows from the anode to the cathode and delivers power to a load circuit. If the SCR is reverse biased, it is non-conductive, and cannot be turned on by a gating signal. Once conduction starts, the gate loses control and current flows from the anode to the cathode until it drops below a certain value (called the holding current), at which point the SCR turns off and the gate electrode regains control. The SCR is thus a solid state device capable of performing the circuit function of a thyratron tube in many electronic applications. In some of these applications, such as in automobile ignition systems and horizontal deflection circuits in television receivers, it is necessary to connect a separate rectifier diode in parallel with the SCR. See, for example, W. Dietz, U. S. Pat. Nos. 3,452,244 and 3,449,623. In these applications, the anode of the rectifier diode is connected to the cathode of the SCR, and the cathode of the rectifier is connected to the SCR anode. Thus, the rectifier diode will be forward biased and current will flow through it when the SCR is reverse biased; i.e., when the SCR cathode is positive with respect to its anode. For reasons of economy and ease of handling, it would be preferable if the circuit function of the SCR and the associated diode rectifier could be combined in a single device, so that instead of requiring two devices and five electrical connections, one device and three electrical connections are all that would be necessary. In fact, because of the semiconductor profile employed, many SCR's of the shorted emitter variety inherently function as a diode rectifier when reverse biased. However, the diode rectifier function of such devices is not isolated from the controlled rectifier portion, thus preventing a rapid transition from one function to the other. Therefore, it would be desirable to physically and electrically isolate the diode rectifier portion from that portion of the device which functions as an SCR.

SUMMARY OF THE INVENTION

The present invention comprises a combination controlled rectifier and diode rectifier device formed in a crystalline semiconductor body having two opposed major surfaces and an edge defining the periphery of the semiconductor body. The body includes four semiconductor regions of alternate conductivity type, with a PN junction between adjacent regions. These four regions include an external region at each of the surfaces, and two intermediate regions; each of the two intermediate regions partially extends to a corresponding one of the surfaces.

A portion of each one of the intermediate regions at the corresponding surface between the adjacent external region and the edge is highly conductive relative to the remainder of that region. These high conductivity portions of the two intermediate regions serve to isolate the diode rectifier function of the device from its controlled rectifier function.

THE DRAWING

DETAILED DESCRIPTION

A preferred embodiment of the present invention will be described with reference to FIGS. 1 and 2.

Figures 1, 2, 3:
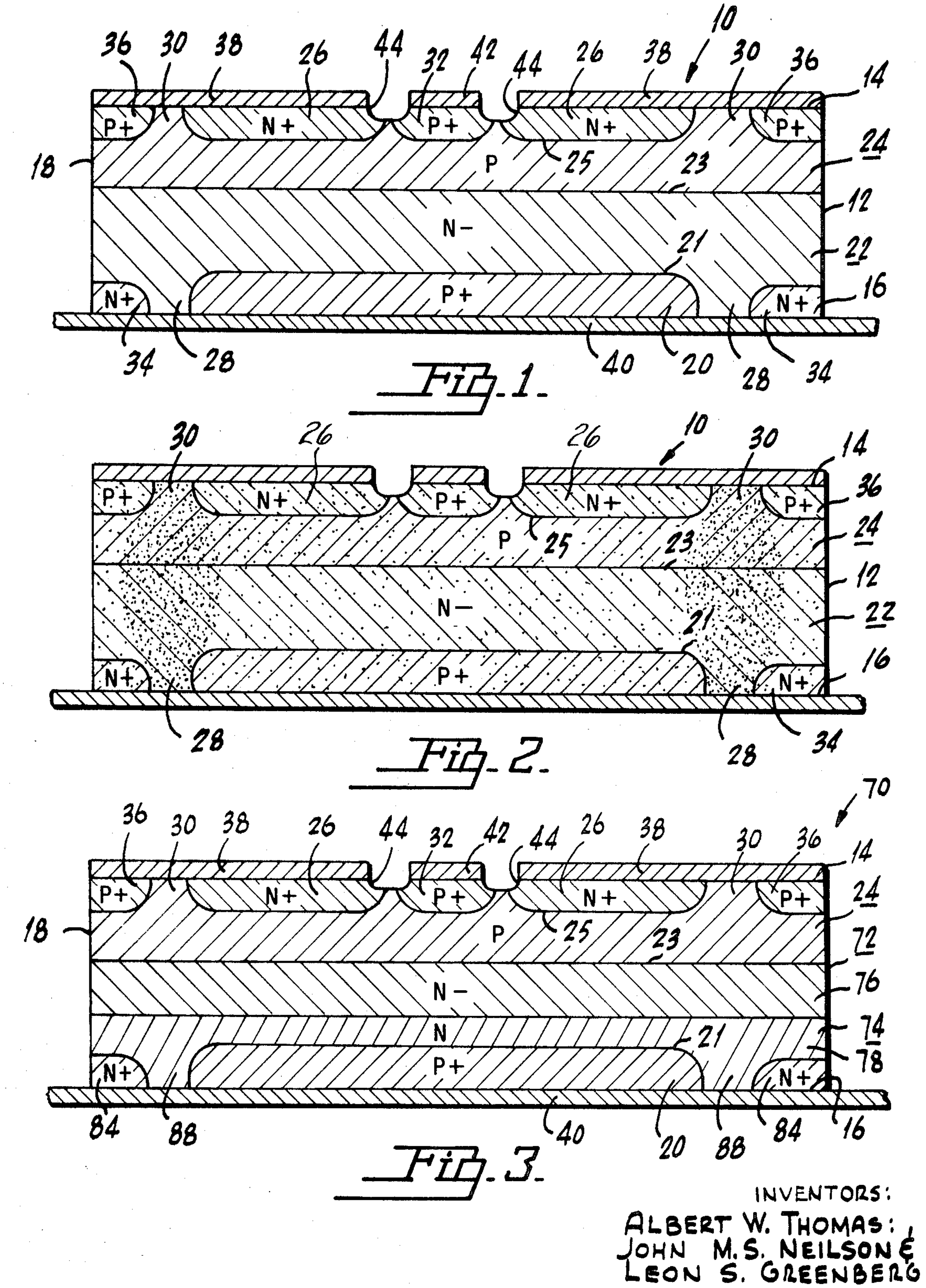
FIG. 1 is a cross-sectional view of the device of the present invention.
FIG. 2 is a second cross-sectional view of the device of FIG. 1.
FIG. 3 is a cross-sectional view of an alternate embodiment of the device of FIG. 1.

Noting FIG. 1, the combination device 10 comprises a crystalline semiconductor body 12 having two opposed major surfaces 14 and 16, and an edge 18 which defines the periphery of the body 12. The size and shape of the body 12 is not critical; however, a cylindrical shape is preferred. By way of example, the body 12 is 6.0–7.0 mils thick and 100–110 mils in diameter. The body 12 includes four semiconductor regions 20, 22, 24, and 26 of alternate conductivity type, with PN junctions 21, 23, and 25, respectively, between adjacent regions. The regions may form a PNPN or NPNP configuration; however, a PNPN configuration is shown in FIG. 1 and described herein. These four regions include two external regions 20 and 26, which are adjacent the two corresponding surfaces 16 and 14, respectively, and further includes two intermediate regions 22 and 24 which are adjacent each other and the two external regions 20 and 26, respectively. In addition, portions of each intermediate region 22 and 24 extend to the corresponding one of the two surfaces. As shown in FIG. 1, a portion 34 of the N type intermediate region 22 which is adjacent the edge 18 at the surface 16 is highly conductive (N+) relative to the remainder of that N type intermediate region, and is spaced apart from the P type external region 20 by a low conductivity portion 28 of the N type intermediate region 22 which extends to the surface 16. In a like manner, a portion 36 of the P type intermediate region 24 which is adjacent the edge 18 at the surface 14 is highly conductive (P+) relative to the remainder of that P type intermediate region, and is spaced apart from the N type external region 26 by a low conductivity portion 30 of the intermediate region 24 which extends to the surface 14. Further, a central portion 32 of the P type intermediate region 24 extends to the surface 14 and, preferably, is of P+ conductivity to facilitate a low resistivity contact to the gate electrode, which is described below.

A first electrode 38 is disposed onto the entire surface 14, except adjacent the central P+ portion 32. This electrode makes direct ohmic contact to the N type external region 26 and those portions 30 and 36 of the P type intermediate region 24 which extend to the surface 14. A second electrode 40 is disposed onto the entire surface 16, and makes ohmic contact to the P type external region 20, and those portions 28 and 34 of the N type intermediate region 22 which extend to the surface 16. A gate electrode 42 makes ohmic contact to the central portion 32 of the P type intermediate region 24 at the surface 14. Preferably, a groove 44 in the surface 14 isolates the first electrode 38 and the gate electrode 42.

The four semiconductor regions 20, 22, 24, and 26, and the first, second, and gate electrodes 38, 40, and 42 form a controlled rectifier which functions in the manner previously described. The two intermediate semiconductor regions 22 and 24 and the first and second electrode 40 and 38 define a diode rectifier which conducts current when the controlled rectifier is reverse biased. The high conductivity portions 34 and 36 of the intermediate regions 22 and 24 limit diode conduction to the periphery of the body 12. A more detailed description of the operation of the device is hereinafter described with reference to FIGS. 4 and 5.

The device 10 preferably further includes a multiplicity of gold recombination centers formed throughout the body 12. The diffusion profiles of those recombination centers are shown, but are not numbered in FIG. 2. Because of the particular manner in which the device is made, as described below, the recombination centers tend to be substantially concentrated in that part of the body 12 between the low conductivity portions 28 and 30 of the two intermediate regions 22 and 24. These gold recombination centers thus effectively form a region of electrical isolation which tends to contain the controlled rectifier function of the device 10 to the central portion of the body 12, and further limit the diode rectifier function of the device 10 to the periphery of the body.

The manner in which the preferred embodiment of the device is fabricated will now be described. The starting material is a body 12 of N type crystalline silicon having a resistivity of about 20 ohm-cm. The PN junction 23 is formed by diffusing a P type impurity into the body with a relatively low surface concentration, on the order of $10^{17}$ atoms per cubic centimeter. This junction 23 may be formed by limiting the doping to surface 14, while surface 16 is protected by a mask of silicon dioxide, or the P type dopant may be allowed to penetrate both surfaces, after which it is removed from surface 16 by an etching or lapping step. Alternatively, PN junction 23 may be formed by an epitaxial deposition of P type silicon on the starting body 12. Insulating layers of silicon dioxide are next grown on the surfaces 14 and 16 of the body 12 by heating the body for about three hours in an ambient of steam. Next, the insulating layers are removed from selected portions of the upper surface 14 and from a portion of the lower surface 16, by using photolithographic techniques well known in the art. The portions removed expose the surfaces over what is to become the external P+ region 20, and the P+ portions 32 and 36.

Thereafter, a P type doping source, such as boron nitride, is applied to the exposed portions of the two surfaces 14 and 16. The body is then heated to 1,150°C. for about one-half hour to diffuse the boron into the body 12.

Next, additional silicon dioxide is grown on the surfaces 14 and 16. The insulating layers are treated with another photolithographic sequence to expose those portions of the surfaces which are to become the external N+ type region 26 and the highly conductive N+ portion 34 of the N type intermediate region 22. The semiconductor body 12 is then heated in the vapors of an N type doping source, such as phosphorous oxychloride, for about two hours at 1,265°C to form those regions.

The remaining portions of silicon dioxide are then stripped away and a thin layer of gold about 25.0 A thick is evaporated or otherwise deposited on each of the surfaces 14 and 16. The body 12 is then placed in a reducing atmosphere at a temperature between 800° to 900°C for about 1 hour, causing gold impurities to diffuse into the body 12. Because gold diffuses much more readily through an undoped or lightly doped region, those portions 28 and 30 of the two intermediate regions 22 and 24 act as "windows" which allow a higher concentration of gold impurities to accumulate in that part of the body between portions 28 and 30. This results in a profile of gold recombination centers within the body as shown and described with reference to FIG. 2.

The remaining gold is removed from the surfaces 14 and 16. The first, second, and gate electrodes 38, 40, and 42 are then deposited on the respective surfaces, as for example, by a nickel electroplating process, and the nickel electrodes are thereafter coated with solder by dipping. The individual devices are separated from the composite wafer, and the groove is etched into each device. The second electrode 40 of each device is then soldered to a metallic surface, which may be a surface of the device enclosure or package.

An alternate embodiment of the combination device is shown in FIG. 3. The alternate device 70 is essentially the same as the device 10 of FIG. 1, except that the intermediate N type region 74 comprises a highly resistive N− region 76 adjacent the P type intermediate region 24, and an N region 78 of higher conductivity than the N-region 76. The N region 78 extends to the lower surface 16 and includes the high conductivity N+ portion 84, which is spaced apart from the adjacent P+ external region 20 by a portion 88 of the N region 78 extending to the surface.

This embodiment is useful when the device is to operate at the highest blocking voltage for a given thickness of the N type intermediate region, because the N region 78 prevents the depletion layer from spreading close enough to the P+ external region 20 to switch the device into conduction.

Fabrication of the device of FIG. 3 may begin with simultaneous diffusion of P and N type dopants into opposite sides of a lightly doped N type wafer. Subsequent steps of masking and diffusing P+ and N+ impurities are then the same as for the device of FIG. 1.

Figure 4:
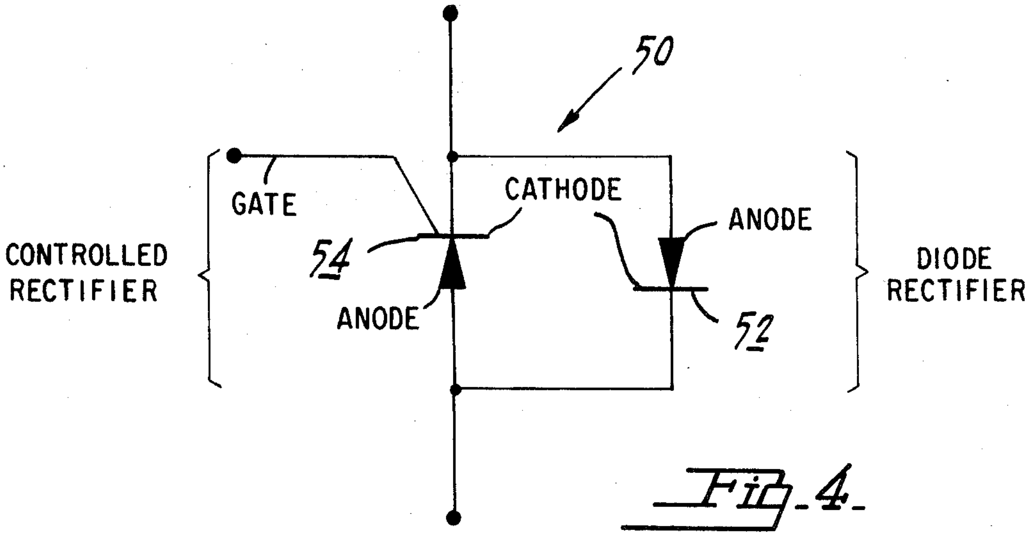
FIG. 4 is a schematic representation of the device of FIG. 1.

FIG. 4 is a schematic circuit representation 50 of the device 10 of FIGS. 1 and 2, in which a diode rectifier 52 is connected in parallel with an SCR 54, with the diode 52 poled for forward conduction in a direction opposite to that of the SCR 54. The device 10 is electrically equivalent to the circuit 50, because a diode junction is provided between the intermediate P region 24, which serves as the anode region of the diode 52, and the intermediate N region 22 which serves as the cathode region for the diode. The first and second electrodes 38 and 40 serve as the anode and cathode electrodes, respectively, for the diode 52 of FIG. 4. The controlled rectifier has the P+N−PN+ profile of regions 20, 22, 24, and 26, respectively, with an anode 40, cathode 38, and gate electrode 42.

In operation,when a positive bias is applied to the cathode of the SCR and a negative bias is applied to the SCR anode, the diode rectifier conducts current. Thus, during periods when the SCR is biased off, the peripheral diode, defined by the P and N− regions 24 and 22 (FIG. 1) is forward biased and conducts current in a direction reverse to the normal conduction of the SCR. The annular highly conductive portions 36 and 34 of those two regions and the gold recombination centers previously described, effectively limit the flow of diode reverse current to the periphery of the body 12. When the SCR 54 is forward biased, it can be triggered into conduction by the application of positive voltage pulses to its gate electrode, causing the device to function in the manner previously described.

Figure 5:
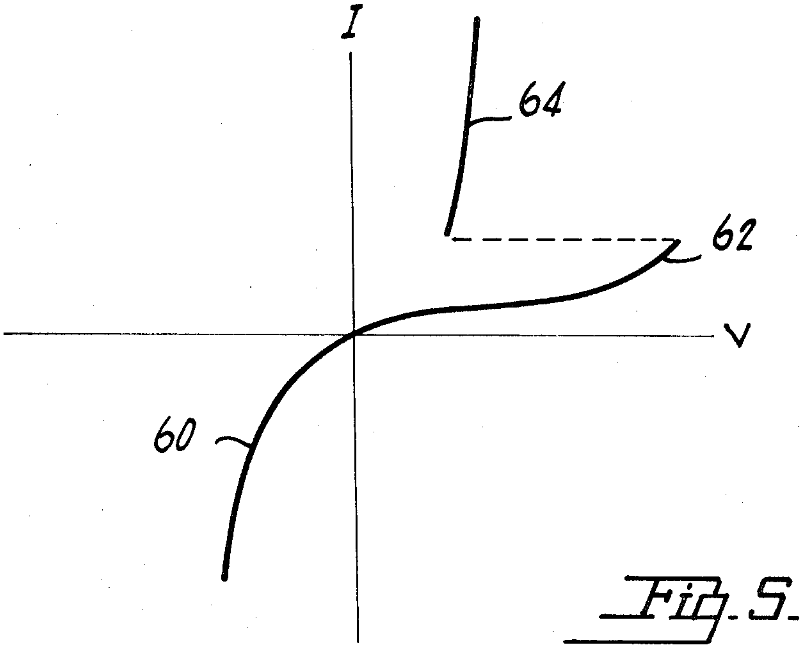
FIG. 5 is a characteristic curve representative of the operation of the device of FIG. 1.

The electrical characteristics of a device constructed in accordance with the foregoing are illustrated in FIG. 5, where the anode to cathode current (ordinate) is plotted against the voltage (abscissa) between the anode and the cathode. When the potential between the anode and the cathode of the SCR is in the reverse non-conducting direction, the SCR portion of the device is non-conductive, but the peripheral rectifying diode is biased in the forward direction, and conducts reverse current. This is shown by that portion 60 of the current-voltage curve. When the polarity of the applied biased voltage is changed to forward bias the SCR, a small leakage current will flow. As the forward bias voltage is increased, a voltage point 62 is reached, at which point the forward current increases rapidly. When the forward current exceeds a critical value, the voltage across the SCR reverts back to a low value. At this point, the SCR is in the "on" condition and the forward current increases rapidly with slight increases in the forward bias voltage. This is shown by the portion 64 of the characteristic curve in FIG. 5.

The above-described device thus incorporates the desirable operating characteristics of an SCR, and has the added feature of being capable of supporting current flow in the reverse direction. This device is therefore suitable for electronic applications requiring an SCR together with a separate parallel-connected diode rectifier.

We claim:

1. An integral thyristor-rectifier device, comprising:

a. a crystalline semiconductor body having two opposed major surfaces;

b. said body including four semiconductor regions of alternate conductivity type, with a PN junction between adjacent regions;

c. said four regions including an external region at each of said surfaces, and two intermediate regions, with each intermediate region including an extension thereof extending to a corresponding one of said surfaces adjacent to a corresponding one of said external regions;

d. a portion of each of said extensions being highly conductive relative to the remainder thereof, the remainder of each of said extensions being disposed between the highly conductive portion thereof and the corresponding adjacent external region and providing isolation therebetween; and wherein e. said highly conductive portion of one of said intermediate region extensions directly opposes said highly conductive portion of the other of said intermediate region extensions;

f. a first electrode contacting a first one of said external regions and the corresponding highly conductive portion of a first one of said intermediate regions;

g. a second electrode contacting a second one of said external regions and the corresponding highly conductive portion of a second one of said intermediate regions; and h. a gate electrode contacting said first intermediate region.

2. An integral thyristor-rectifier device according to claim 1, wherein said body further includes a multiplicity of recombination centers formed therein, said recombination centers being substantially concentrated in said body between the relatively low conductivity portions of each said extensions.

3. An integral thyristor-rectifier device according to claim 2, wherein said recombination centers comprise gold impurities.

4. An integral thyristor-rectifier device, comprising:

a. a crystalline semiconductor body having two opposed major surfaces and an edge defining the periphery of said body;

b. said body including four semiconductor regions of alternate conductivity type with a PN junction between adjacent regions;

c. said four regions including an external region at each of said surfaces, and two intermediate regions, with each intermediate region partially extending to one of said surfaces;

d. a first electrode contacting a first one of the external regions and an exposed portion of a first one of the intermediate regions adjacent said first external region, at a first one of said surfaces;

e. a portion of said first intermediate region adjacent said edge at said first surface being highly conductive relative to the remainder of said region, said highly conductive portion being spaced apart from said first external region by isolation means which comprise a low conductivity portion of said first intermediate region extending to said first surface;

f. a second electrode contacting a second one of the external regions and a portion of a second one of the intermediate regions adjacent the second external region, at the second one of said surfaces;

g. a portion of said second intermediate region adjacent said edge at said second surface being highly conductive relative to the remainder of said region, said second highly conductive portion being spaced apart from said second external region by isolation means which comprise a low conductivity portion of said second intermediate region extending to said second surface;

h. a gate electrode contacting said first intermediate region at said first surface; and wherein i. said four regions and said first, second, and gate electrodes define a controlled rectifier which conducts current in one direction, and said intermediate regions and said first and second electrodes define a diode rectifier which conducts current along the periphery of said body when said controlled rectifier is reverse biased.

5. An integral thyristor-rectifier device according to claim 4, wherein said body further includes a multiplicity of recombination centers formed therein, said recombination centers being substantially concentrated in said body between the relatively low conductive portions of said intermediate regions extending to said surfaces.

6. An integral thyristor-rectifier device according to claim 4, wherein said first external region and said second intermediate region are N type, and said second external region and said first intermediate region are P type.

7. An integral thyristor-rectifier device according to claim 6, wherein said second intermediate N type region comprises an N− region adjacent said first intermediate P region and an N region adjacent said N− region, said N region extending to said second surface and including said highly conductive portion.

* * * * *